United States Patent [19]

Stutius

[11] 4,422,888
[45] Dec. 27, 1983

[54] METHOD FOR SUCCESSFULLY DEPOSITING DOPED II-VI EPITAXIAL LAYERS BY ORGANOMETALLIC CHEMICAL VAPOR DEPOSITION

[75] Inventor: Wolfgang E. Stutius, Los Altos, Calif.

[73] Assignee: Xerox Corporation, Stamford, Conn.

[21] Appl. No.: 239,080

[22] Filed: Feb. 27, 1981

[51] Int. Cl.$^3$ .................. H01L 21/365; H01L 29/22
[52] U.S. Cl. ................................. 148/175; 156/606; 156/613; 357/16; 357/61
[58] Field of Search ............... 148/174, 175; 156/606, 156/613; 357/16, 61

[56] References Cited

U.S. PATENT DOCUMENTS

| | | | |
|---|---|---|---|
| 3,173,814 | 3/1965 | Law | 148/175 |
| 3,312,571 | 4/1967 | Ruehrwein | 148/175 |
| 3,364,084 | 1/1968 | Ruehrwein | 148/175 |
| 3,549,434 | 12/1970 | Aven | 148/186 |
| 3,916,510 | 11/1975 | Martin | 148/175 X |

OTHER PUBLICATIONS

"The Luminescence Center in Self-Activated ZnS Phosphors", J. S. Prener and D. J. Weil, Journal Of The Electrochemical Society, vol. 106, pp. 409-413 (May, 1959).
"The Use of Metal-Organics in the Preparation of Semiconductor Materials", H. M. Monasevit and W. I. Simpson, Journal of Electrochemical Society, vol. 118, No. 4, p. 644-647 (Apr., 1971).
"Growth & Characterization of Undoped ZnSe Epitaxial Layers Obtained By Organometallic Chemical Vapour Deposition", P. Blanconnier et al., Thin Solid Films, vol. 55, pp. 375-386 (1978).
"Organometallic Vapor Deposition of Epitaxial ZnSe Films on GaAs Substrates", Wolfgang Stutius, Applied Physics Letters, Vol. 33(7), pp. 656-658 (Oct. 1, 1978).
"Luminescence in Highly Conductive n-Type ZnSe", J. C. Bouley et al., Journal of Applied Physics, vol. 46(8), pp. 3549-3555 (Aug., 1975).
"High Conductivity ZnSe Films", Julio Aronovich et al., Journal of Applied Physics, vol. 49(4), pp. 2584-2585, (Apr., 1978).
"Physics & Chemistry of II-VI Compounds", edited by M. Aven and J. S. Prener and published and distributed by American Elsevier Publishing Co., Inc., pp. 596-609 (1967).
"Shallow Acceptors and P-type ZnSe", K. Kosai et al., Applied Physics Letters, vol. 35(2), pp. 194-196 (Jul. 15, 1979).
"Molecular Beam Epitaxial Growth of Low-Resistivity ZnSe Films", T. Yao et al., Applied Physics Letters, vol. 35(2), pp. 97-98 (Jul. 15, 1979).
"Photoluminescence and Heterojunction Properties of $ZnS_x Se_{1-x}$ Epitaxial Layers on GaAs and Ge Grown By Organometallic CVD", Wolfgang Stutius, Journal of Electronic Materials, vol. 10(1), pp. 95-109, (Jan., 1981).
"Self-compensation-Limited Conductivity in Binary Semiconductors, III, Expected Correlations With Fundamental Parameters", G. Mandel, F. F. Morehead and P. R. Wagner, Physical Review, vol. 136(3A), pp. A826-A832 (Nov. 2, 1964).
"Pair Spectra and the Shallow Acceptors in ZnSe", J. L. Merz, K. Nassau, and J. W. Shiever, Physical Review, vol. B8(4), pp. 1444-1452 (Aug. 15, 1973).
"Phosphrous and Arsenic Impurity Centers in ZnSe. II, Optical and Electronic Properties", A. R. Reinberg, W. C. Holten, M. de Wit, and R. K. Watts, Physical Review, vol. B3(2), pp. 410-416 (Jan. 15, 1971).
"Properties of Al and P Ion-implanted Layers in ZeSe", Y. S. Park, B. K. Shin, D. L. Look and D. L. Downing in the book "Ion Implantation in Semiconductors", p. 245-252, edited by S. Namba (Plenum Press, New York, 1975).
"N-Ion Implantation into ZnSe", C. H. Chung, H. W. Yoon, H. S. Kang and C. H. Tai in the book Ion Implantation in Semiconductors, pp. 253-259, edited by S. Namba (Plenum Press, New York 1975).

*Primary Examiner*—W. G. Saba
*Attorney, Agent, or Firm*—W. Douglas Carothers, Jr.

[57] ABSTRACT

A low-pressure, low-temperature organometallic chemical vapor deposition (OM-CVD) method for depositing a doped epitaxial layer of a II-VI compound, such as, n-ZnSe, on a substrate in the deposition zone of an OM-CVD reactor. For example, low-resistivity n-type ZnSe with $p < 0.05 \Omega \cdot cm$ and $n > 10^{17}$ cm$^{-3}$ may be grown epitaxially on (100) GaAs substrates by this method using aluminum as a dopant from a triethylaluminum source. The as-grown layers show a strong near-bandgap photoluminescence peak. The much weaker photoluminescence intensity at longer wavelength indicates that the concentration of deep centers is lower than in doped ZnSe prepared by other prior art methods. Also, no further or post treatment (diffusion or annealing) after growth is necessary.

9 Claims, 7 Drawing Figures

METHOD FOR SUCCESSFULLY DEPOSITING DOPED II-VI EPITAXIAL LAYERS BY ORGANOMETALLIC CHEMICAL VAPOR DEPOSITION

BACKGROUND OF THE INVENTION

This invention relates to a method for the production of epitaxial films of single crystalline characteristic and, in particular, to a method for depositing doped II-VI epitaxial layers, such as, ZnSe, by organometallic chemical vapor deposition (OM-CVD). Epitaxial films prepared in accordance with this invention may be prepared from volatile compounds and elements of zinc, cadmium and mercury with volatile compounds and elements of sulfur, selenium and tellurium. Compounds to consider are the binary and ternary compounds within these groups of elements.

There is voluminous prior art involving the production of II-VI epitaxial films and devices and, in particular, zinc selenide (ZnSe) films and devices. ZnSe is a direct bandgap semiconductor with a bandgap of 2.67 eV at room temperature. Because of its wide bandgap, ZnSe has a high potential for light emitting devices emitting radiation in the visible range of the spectrum and this is why there has been so much interest in this semiconductor compound in the past. To date, however, there has been no long term success in the employment of ZnSe and its II-VI companions in semiconductor devices.

Examples of prior art are found in U.S. Pat. Nos. 3,173,814; 3,312,571 and 3,364,084. Examples in the literature are the articles, "The Luminescence Center in Self-Activated ZnS Phosphors, J. S. Prener and D. J. Weil, *Journal Of The Electrochemical Society.* Volume 106, page 405 (1959). "The Use of Metal-Organics in the Preparation of Semiconductor Materials", H. M. Monasevit and W. I. Simpson, *Journal of Electrochemical Society,* Volume 118, No. 4, p. 644 et al (1971); "Growth & Characterization of Undoped ZnSe Epitaxial Layers Obtained By Organometallic Chemical Vapor Deposition", P. Blanconnier et al, *Thin Solid Films,* Volume 55, pp 375–886 (1978); "Organometallic Vapor Deposition of Epitaxial ZnSe Films on GaAs Substrates", Wolfgang Stutius, *Applied Physics Letters,* Volume 33(7), Oct. 1, 1978; "Luminescence in Highly Conductive n-Type ZnSe", J. C. Bouley et al, *Journal of Applied Physics,* Volume 46(8), August 1975; "High Conductivity ZnSe Films", Julio Aronovich et al, *Journal of Applied Physics,* Volume 49(4), page 2584 et al, April, 1978. Also, there is the book of "Physics & Chemistry of II-VI Compounds", edited by M. Aven and J. S. Prener and published and distributed by American Elsevier Publishing Co., Inc. (1967) which discusses, for example ZnSe beginning on page 596.

Early work on ZnSe focused on the properties of bulk crystals which are grown by either vapor transport or by direct reaction between the elements Zn and Se at high temperatures and high pressures. The crystals are usually rather small and contain a large number of intrinsic defects (dislocations, vacancies, etc.) due to the high growth temperature. The as-grown, highly resistive bulk ZnSe crystals ($\rho > 10^{12}$ Ω.cm) can be converted to low resistivity n-type material by diffusing a group III element (Al, Ga, or In) at high temperatures, followed by an anneal in zinc vapor. This "zinc extraction treatment" reduces the number of zinc vacancies which form complexes with the donor atoms and act as deep trapping centers. The doped crystals obtained by these processes are, however, still highly compensated and contain a large concentration of unwanted deep acceptor states. This is usually evident in the large intensity of the self-activated (SA) part of the photoluminescence spectrum. Also, carrier concentrations and mobilities are low compared to Ge, Si, or the III-V compound semiconductors.

Although studies of bulk ZnSe crystals are useful to clarify some of the fundamental aspects, the preparation of high quality thin films is certainly desirable from device point of view. Since single crystalline ZnSe substrates with a low dislocation density are difficult to obtain, most of the thin film studies are done on GaAs or Ge substrates. ZnSe is lattice-matched rather well to GaAs and Ge, with a ~5.667 Å for ZnSe, a ~5.6534 Å for GeAs, and a ~5.658 Å for Ge at room temperature. Thin epitaxial films of ZnSe have been prepared by vapor transport evaporation, sputtering, liquid phase epitaxy [e.g. the article, "Shallow Acceptors and P-type ZnSe", [K, Kosai et al, *Applied Physics Letters,* Volume 35, p. 194 (1979)], molecular beam epitaxy [T. Yao et al, *Applied Physics Letters,* Volume 35, p. 97 (1979)], and organometallic chemical vapor deposition (OM-CVD) [e.g., the articles of P. Blanconnier et al and Stutius, supra]. The experimental results suggest that the material obtained by the last two methods is superior in quality, as judged by the excellent surface morphology and the low concentration of deep centers seen in photoluminescence studies.

The preparation of thin layers of ZnSe by OM-CVD is especially appealing because of its simplicity and versatility. This deposition method can also easily be adapted for the fabrication of inexpensive large area devices. In the OM-CVD process, ZnSe is formed by reacting dimethylzinc or diethylzinc with hydrogen selenide inside a quartz reactor. Details of the reactor design and the growth conditions have been published [e.g., the Article of Stutius, supra]. The remaining small lattice mismatch between the GaAs or Ge substrates and the ZnSe layers can be overcome by adding a small amount of H$_2$S to the gas stream during the deposition to form $ZnS_xSe_{1-x}$. The exact lattice match to GaAs occurs for x=0.052 and to Ge for x=0.035. The results from photoluminescence studies suggest that the interface between $ZnS_xSe_{1-x}$ and the GaAs substrates is much improved near the lattice-matched composition. See the article, "Photoluminescence and Heterojunction Properties of $ZnS_xSe_{1-x}$ Epitaxial layers on GaAs and Ge Grown By Organometallic CVD", Wolfgang Stutius, *Journal of Electronic Materials,* Vol. 10(1), January, 1981. This is evident from the width of the near-bandgap PL peak and the intensity of the self-activated PL which both have a mimimum near x=0.05 signifying a relief of the strain and a reduced number of defects at the interface.

ZnSe and $ZnS_xSe_{1-x}$ layers prepared by OM-CVD without intentional doping are highly resistive. From C-V measurements of ZnSe layers deposited on n-GaAs and from vander-Pauw resistivity and Hall effect measurements of ZnSe layers deposited on Cr-doped seminsulating GaAs substrates we concluded that the electrical resistivity of these layers is greater than $10^5$Ω.cm.

The direct synthesis of highly conductive ZnSe is of great technological interest because the availability of low resistivity n and p-type ZnSe will lead to the successful fabrication of II-VI electroluminescent devices which is yet to be a commerical reality in face of all the past work in this area of technology.

SUMMARY OF THE INVENTION

According to this invention, thin high conductive doped II-VI layers, such as ZnSe, can be grown directly by low pressure organometallic chemical vapor deposition (OM-CVD) at comparatively lower temperature conditions producing materials having a lower concentration of intrinsic defects and stronger bandgap luminescence eliminating processing (1) at high temperatures conducive of contamination and defect formation, (2) with addition treatments, such as, diffusion or annealing, or (3) using a halide transport system, the elements of which may act as an undesirable incorporated impurity.

The method is particularly characterized by heating the deposition zone of an OM-CVD reactor where the substrate is subjected to a low temperature, i.e., a temperature sufficient to provide enough surface mobility of the deposited species to form a smooth epitaxially deposited layer but not so high as to produce large numbers of native intrinsic defects, present in the prior art methods, and also maintaining a balance with the rate of deposition while preventing elemental re-evaporation [e.g. 300° to 400° C.], maintaining a low pressure [e.g. below 0.20 Torr] in the reactor, introducing a gaseous phase mixture of II and VI components [e.g. $H_2Se$ and $(CH_3)_2Zn$] and supplying the vapor phase of a dopant agent [e.g. $(CH_5)_2Al$] into the reactor, the reactor being provided with conduit means to the region of the deposition zone for exit of one of the gaseous phase compounds in close proximity to the substrate.

The dopant may be either a volatile liquid placed in an inert container through which a carrier [e.g. hydrogen] flows, or a gaseous compound [e.g. $NH_3$, $PH_3$, etc.].

The dopant concentration may be varied during the deposition by adjusting either the temperature of the container containing the volatile dopant or the rate of flow of the carrier gas through the container containing the volatile dopant or a combination of both.

The dopant may be either n-type (aluminum, gallium or indium) or p-type (nitrogen, phosphorus, arsenic or antimony).

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENT

Figure 1:
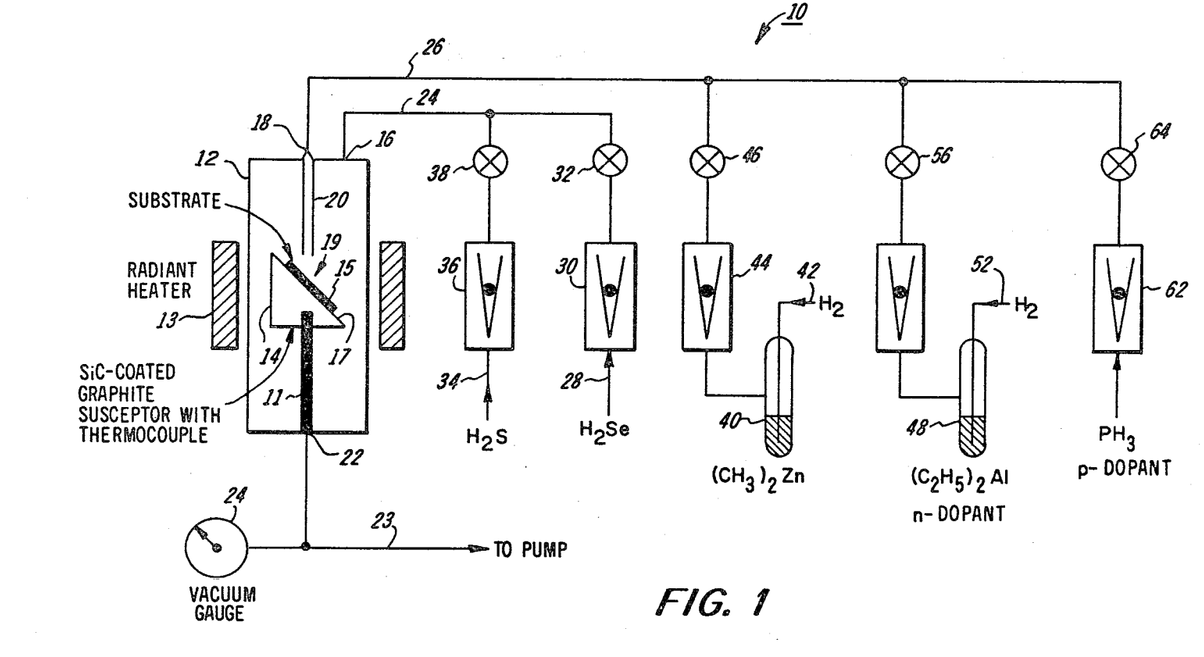
FIG. 1 is a schematic diagram of an OM-CVD system in which the method of this invention may be practice.

In FIG. 1, a schematic of an OM-CVD system 10 is shown in which the method of this invention may be practiced. System 10 is operated as a combination low temperature and low pressure system and includes a vertical reactor 12, within which is supported the susceptor 14 on support 11 and is provided with reactant gas inputs 16 and 18. Outlet 22 is coupled to a pumping source via exhaust line 23. Line 23 also includes gauge 24 to monitor the system pressure. A horizontal reactor can also be employed rather than a vertical reactor.

A substrate 15 is supported on a susceptor 14 supported in reactor 12. Radiant heater 13 surrounds the central portion of the reactor 12 and supplies heat to the region of the susceptor 14 and substrate 15 which is defined as the deposition zone 19. The heater 13 may comprise a radiant heater, such as, a quartz iodine lamp, a furnace heater, etc. or, alternatively, may comprise an rf inductive heater if the process is carried out under such pressure conditions so that no RF plasma discharge occurs.

The reactor 12 may, for example, consist of 35 cm long quartz tube with a diameter of about 54 mm with stainless steel flanges on both ends.

The reactant gases are introduced at the top of the reactor 12 via supply lines 24 and 26 connected, respectively, to reactor 12 at inputs 16 and 18. Conduit means 20, in the form of a tube supported in the reactor 12 downwardly from input 18, extends to be within the deposition zone 19 and in close proximity to the top surface of substrate 15. The spacing between the end of the tube 20 and the surface of the substrate 15 may be, for example, about 1 to 5 cm.

For best results, the reactant gases in supply line 24 should be kept separate from the reactant gases in supply line 26 until they reach the vicinity of the deposition zone 19 because they tend to readily combine in the gas phase at the lower temperatures of operation used in the method, herein described, before reaching the heated susceptor 14. Also, to suppress even further, gas phase reactions prior to the reactant gases actually reaching the surface of the substrate 15, the partial pressure of the reactant gases is reduced which concurrently increases their flow velocity, that is, by providing a low pressure deposition system at low pressures, the turbulent flow inside the reactor is practically eliminated. The resulting epitaxially deposited layers are also much more uniform in thickness.

Susceptor 14 may be comprised of SiC coated with graphite. The temperature of the susceptor 14 and deposition zone is held at a low temperature, for example, in the range of 300° C. to 400° C. during epitaxial deposition.

A temperature of about 340° C. has been used in most of my work carried out under this method practiced with system 10. This temperature is lower than temperatures employed in the prior art processes. The lower temperature provides a better chance of obtaining a smaller amount of defects in the deposited material because the number of defects increases with increases of temperature for thermodynamic reasons. On the other hand, the temperature has to be high enough to obtain a continuous and adhering film and obtain proper decomposition and pyrolyzation at the deposition zone.

The operation at lower temperatures reduces the possibility for diffusion at the substrate-II-VI interface or between the II-VI layers having different dopants or dopant concentrations.

The temperature of the susceptor 14 may also be monitored by a thermocouple housed in support 11.

The pressure in the reactor 12 during epitaxial deposition is typically between 10 to 200 m Torr, although there is some indication in my work that the operating pressures may be higher and the method still successfully practiced, although it is not presently clear that this may be advantageous in the practice of the method. Depositions at atmospheric pressure, however, appear to cause excessive gas phase reactions and prevent the growth of smooth epitaxial layers regardless of substrate temperatures or the choice of substrate materials. In the article of Manesevit et al, previously mentioned, a similar observation was also made of a rough surface morphology in epitaxially grown ZnSe layers on oriented oxide substrates in OM-CVD processing carried out under atmospheric pressure.

The employment of a low pressure system has the advantage of reducing the chances of compound formation in the gas phase prior to substrate deposition. By employing high flow velocity through the reactor, any compounds formed in the gas phase are swept out of the system.

The surface 17 of the susceptor 14 may be substantially horizontal or perpendicular to the gas stream or may be positioned at an angular position as shown in FIG. 1. The angled surface improves the gas flow pattern in the reactor 12, resulting and results in a better surface morphology. The flow pattern is more like that of the movement of air over an air foil with little or no turbulance.

In FIG. 1, several organometallic sources are shown. Specific reference is made to examples of ZnSe and $ZnS_xSe_{1-x}$ as II-VI binary and ternary compounds that may be n-doped with Al or p-doped with P, although the method herein disclosed should not be construed as limited to these particular II-VI compounds or dopants. Substrate 15 may be a (100) or (111) p or n-GaAs or (111)Ge substrate, doped or undoped.

ZnSe is formed by reacting dimethylzinc (DMZ) or diethylzinc (DEZ) with hydrogen selenide, $H_2Se$, inside the reactor 12. $H_2Se$ is introduced at the top of the reactor 12 at inlet 16 via supply line 24 from source 28, through flow controller 30 and shut off valve 32. Also shown is a $H_2S$ source 34, flow controller 36 and shut off valve 38. In the discussion to follow, control valve 38 is closed.

Organometallic zinc source 40 consists of a stainless steel bubbler containing dimethylzinc (DMZ), for example, which is held at 0° C. in order to lower the vapor pressure of the source and to have better control over the gas flow without having unacceptable low flow rates. Hydrogen with a controlled flow rate (flow controller for hydrogen not shown) from source 42 passes through the bubbler 40 at atmospheric pressure, and is saturated with DMZ of the appropriate partial pressure, such as, 124 mm Hg at 0° C. A needle control valve 44 and shut off 46 are positioned in the supply line 26 between the bubbler 40 and the reactor 23. The pressure drops across valve 44 to the lower pressure of the reactor 12.

In a typical nondoping deposition run, the susceptor 14 and the substrate 15 are heated to the deposition temperature of, for example, 340° C. under vacuum. The reactant gas flow is established during the same period of time, however, bypassing the reactor 12 (bypassing not shown).

At the start of epitaxial deposition, the flow of the two reactants, DMZ and $H_2Se$, is directed to the reactor 12. The low pressure in the reactor is sufficient to suppress the gas phase reaction between the $H_2Se$ and the DMZ. Their combinative reaction is also deterred by the introduction of the DMZ via tube 20 in proximity to the surface of the substrate 15. The introduction of these gases via supply lines 24 and 26 may be done either simultaneously or sequentially, with no noticable difference in the results of deposition. At the end of deposition, the heater 13 and the DMZ flow are turned off at valve 46. The sample is then allowed to cool down in an $H_2Se$ atmosphere, typically to below 250° C. At this time, the $H_2Se$ flow is also turned off at valve 32. The sample is then permitted to cool down to room temperature in vacuum provided by pumping on line 23 or in an inert gas ambient. The initial cool down with an $H_2Se$ environment is believed to be desirable to avoid any dissipation of Se molecules from the sample. However, it is not clear that this treatment is essential, as it may be only incidentally helpful.

A dopant during the epitaxial deposition just discussed may also be supplied from either the n-dopant source 48 or the p-dopant source 50. Source 48 consists of a stainless steel bubbler containing, for example, the organometallic compound trimethylaluminum (TMAl) or triethylaluminum (TEAl). Also, tri(m)ethlgallium or tri(m)ethylindium may be suitable as an n-type dopant. TEAl is preferred because of its low decomposition temperature of 150° C. and its low vapor pressure and, therefore, is easier to incorporate as a dopant. The molecular bonds of TEAl are weaker, making its incorporation as a dopant more probable at lower temperatures.

The hydrogen carrier gas from source 52 bubbles through the bubbler 48 at atmospheric pressure and is saturated with the organometallic compound content at its vapor pressure. Shut off valve 56 and needle control valve 54 are installed between the bubbler 48 and the reactor 12 and the pressure across the valve 54 drops to the lower pressure of the reactor. The different reactant gases, DMZ, $H_2Se$, and TEAl, are not mixed until they enter the reactor 12. Both the dopant TEAl and the constituent DMZ are both introduced through the center tube 20 via supply line 26. The dopant may also be introduced through a separate port or inlet or together with the $H_2Se$ via line 24.

The dopant concentration may be varied by either adjusting the temperature of the bubbler reservoir 48 of the dopant and/or the flow rate of the carrier gas from source 52.

The susceptor 14 and substrate 15 are heated to 340° C. in vacuum. The initial gas flow of the three vapor phase reactant gases is established bypassing the reactor. When the deposition temperature is reached, the gases are directed to the reactor, either simultaneously or sequentially, making sure, however, that the dopant source gas is directed through the reactor only after the other two reactant gases are initially in the reactor in order to avoid deposition of a dopant element at the substrate-film interface.

At the end of the deposition, i.e. when the derived layer thickness is achieved, the organometallic sources are turned off simultaneously with the heater, and the sample is allowed to cool down in an H$_2$Se ambient in order to avoid loss of selenium. Again, it is not clear if this precaution is necessary.

Source 50 comprises a p-type dopant using NH$_3$, PH$_3$ or AsH$_3$ or the corresponding organometallic compounds triethylphosphine, tri(m)ethylarsenic or tri(m)ethylantimony through a bubbler. These p-type dopants may be incorporated in the layer during growth in the same manner as explained relative to n-type dopants. Flow controller 62 and shut off valve 64 are installed between the source 50 and the reactor 12 and the pressure across the flow controller 62 drops to the lower pressure of the reactor.

P-type doping can, in principle, be achieved in the deposition of ZnSe either by substituting zinc by an atom of the group I elements (Li, Na, K, Rb, ...) or by substituting selenium by an atom of the Group V elements (N, P, As, Sb, ...).

Past work using the Group I alkali metals as a p-type dopant has not met with great success, due to the fact that these atoms also tend to go into the crystal lattice interstitially to form donorlike native defects and complexes involving native defects [See, for example, the articles, "Self-compensation-Limited Conductivity in Binary Semiconductors", G. Mandel, F. F. Morehead and P. R. Wagner, *Physical Review,* Volume 136A, p. 826 (1964) and "Pair Spectra and the Shallow Acceptors in ZnSe", J. L. Merz, K. Nassau, and J. W. Shiever, *Physical Review,* Volume B8, p. 1444 (1973)].

Most past work using the group V elements as p-type dopants has shown that these atoms tend to be deep acceptors ($E_a > 0.2$ eV), thus acting as electron traps rather than acceptors [see, for example, the articles of A. R. Reinberg, W. C. Holten, M. De Wit, and R. K. Watts, "Phosphorous and Arsenic Impurity Centers in ZnSe. II. Optical and Electronic Properties", *Physical Review,* Volume B3, p. 410 (1971)]. Ion implantation studies [see, for example, the article "Properties of Al and P Ion-implanted Layers in ZeSe", Y. S. Park, B. K. Shin, D. L. Look and D. L. Downing in "Ion Implantation in Semiconductors", editor S. Namba (Plenum Press, New York, 1975), p. 245 and the article, "N-Ion Implantation into ZnSe", C. H. Chung, H. W. Yoon, H. S. Kang and C. H. Tai, p.253] using nitrogen and phosphorus, however, have shown that these elements can be shallow acceptors. However, the reported free carrier concentrations and mobilities are rather low and not practical for p-n device fabrication. Also, the annealing step at elevated temperatures required after implantation to activate the implanted atoms will most likely introduce unwanted deep trapping centers. The disclosed method may provide a more practical incorporation of these elements as a p-type dopant.

The procedure for p-type dopant introduction is the same as previous explained in connection with n-type dopants.

Ternary compounds, such as, ZnS$_x$Se$_{1-x}$ may be epitaxially deposited in system 10. As previously mentioned, the small lattice mismatch between the GaAs or Ge substrates and ZnSe layers can be overcome by adding a small amount of H$_2$S to the gas stream during the deposition to form ZnS$_x$Se$_{1-x}$. The operation of system 10 is the same as explained previously except valve 38 is opened and an H$_2$S-H$_2$Se mixture is introduced via supply line 24 into reactor 12 at inlet 16 while the dopant and DMZ gas mixture is introduced via supply line 26 into reactor 12 at the exit of tube 20. The molar fraction, x, in the deposited ZnS$_x$Se$_{1-x}$ layers can be varied continuously by adjusting the ratio of H$_2$S to H$_2$Se flows of the reactant gases. The H$_2$S and H$_2$Se sources may consist, for example, of a mixture of 10% H$_2$S and 10% H$_2$Se, respectively, in 90% hydrogen. As mentioned previously, the reactant gases of the group VI elements have to be kept separate from the reactants containing the group II elements because they tend to combine readily at these lower operating temperatures in the gas phase before reaching the surface of the heated substrate.

The epitaxial growth rates of ZnSe or ZnS$_x$Se$_{1-x}$ may vary from less than 1 to above 5 μm per hour depending primarily on the parameters of the reactor design, the deposition zone temperature and the reactant gas flow rates.

The procedure for dopant introduction during the epitaxial deposition of ZnS$_x$Se$_{1-x}$ layers is the same as previous explained in connection with dopant introduction during the epitaxial deposition of ZnSe layers.

AN EXAMPLE OF THE PREFERRED EMBODIMENT

Reference is now made to a specific example based upon the previous discussion. This is only an example, as the method can be carried out employing other mentioned II-VI elements and dopants.

The epitaxial n-type ZnSe layers were prepared by OM-CVD using dimethylzinc (DMZ) and a mixture of 10% H$_2$Se in hydrogen as reactant gases. The ratio of H$_2$Se to DMZ was between 5:1 and 10:1 in atomic percent. Although any one of the organometallic group III alkyls seems to be suitable as an n-type dopant, as previously mentioned, triethylaluminum (TEAl) is selected because of its low decomposition temperature of 150° C. and its lower vapor pressure. TEAl was introduced together with the DMZ through the center tube 20 in order to avoid possible reactions with the H$_2$Se in the gas phase. The dopant concentration was adjusted by varying the flow rate of the hydrogen carrier gas through the TEAl bubbler 48 and varying the temperature of the bubbler cylinder between 0° C. and 25° C. Si-doped n-type (100) GaAs ($\rho = 0.01 \Omega$.cm), p-type Zn doped (100) GaAs ($\rho = 0.01 \Omega$.cm) and Cr-doped (100) GaAs ($\rho < 10^7 \Omega$.cm) wafers were used as substrates. Other types of substrate materials can be employed which are lattice matched or pseudo latticed matched for defect density, such as, Ge, spinel or sapphire. The substrate temperature during the deposition was 340° C. and the pressure in the reactor 100 mTorr. A typical growth rate was about 1.5 μm/hour. The layers ranged in thickness from 1.2 to 5.5 mm and had a smooth surface morphology.

The properties of the layers were investigated by photoluminescence, Hall measurements, and C-V profiling. Conductivities of higher than 20 ($\Omega$.cm)$^{-1}$ were observed in the as-grown ZnSe layers with typical carrier concentrations of greater than 10$^{17}$ cm$^{-3}$ and mobilities of about 200–400 cm$^2$/V-sec at room temperature. This conductivity level is better than the previously reported in the literature electrical conductivities which were in the order of 1–10($\Omega$-cm)$^{-1}$.

Figure 3:
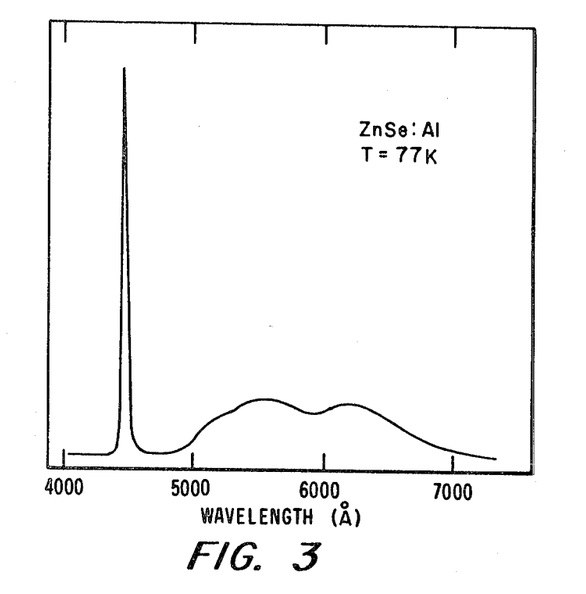
FIG. 3 is a photoluminescence spectra of an Al doped ZnSe layer deposited on a <100> GaAs substrate.
Figure 5:
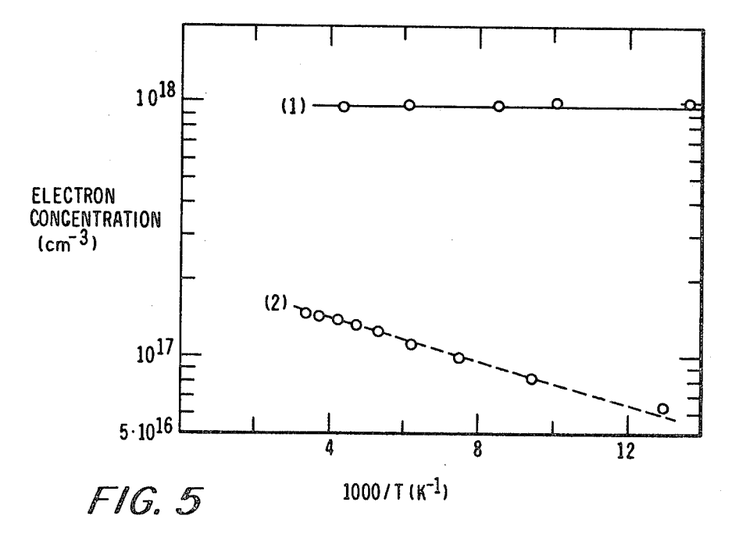
FIG. 5 characterizes the temperature dependence of the carrier concentration for a degenerate (1) and a nondegenerate (2) Al-doped n-type ZnSe layer deposited on a n-GaAs substrate.

A typical photoluminescence spectrum of a 1.5 μm thick Al-doped ZnSe layer on n-type (100) GaAs measured at 77K is shown in FIG. 3. The photoluminescence was excited by a He-Cd laser operating at 10 mW cw power at a wavelength of 3250 Å. The photoluminescence efficiency of the as-grown layers is dominated by the near-bandgap photoluminescence which has not been observed in n-type ZnSe prepared by conventional methods. Such an efficient near bandgap photoluminescence of doped ZnSe is desirable for practical electroluminescent p-n devices. As shown in FIG. 5 at curve (2), the typical concentration of free carriers in this layer was approximately $1.6 \cdot 10^{17}$ cm$^{-3}$ at room temperature.

Figure 4:
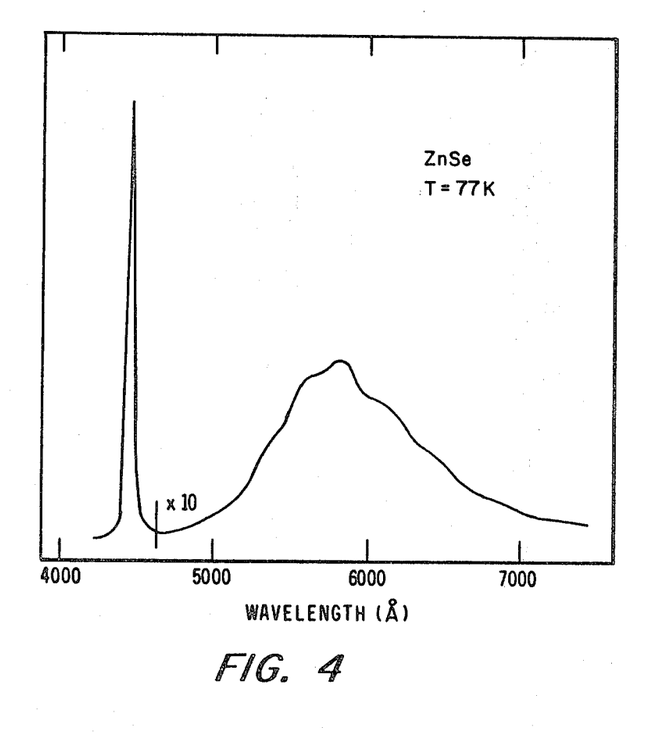
FIG. 4 is a photoluminescence spectra of undoped ZnSe layer deposited on a <100> GaAs substrate.

For comparison, the photoluminescence spectrum of an undoped ZnSe layer is shown in FIG. 4. The photoluminescence spectrum of the doped ZnSe layer is dominated by the near-bandgap peak with a maximum at 4462 Å at 77K.

These features in the photoluminescence spectrum should be compared with the results obtained in bulk crystals in the article of Bouley et al, supra. There was no observance of bandgap photoluminescence intensity at 77K unless the crystal was treated in zinc overpressure after the Al diffusion step. Even after the zinc treatment, the near-bandgap peak was still much weaker than either the donor-acceptor pair bands or the SA photoluminescence band.

No donor-acceptor pair bands are observed in the layers grown by this OM-CVD method, and the intensity of the SA photoluminescence band is smaller than the near-bandgap photoluminescence by one order of magnitude. The maximum at 6300 Å is believed to be due to an Al-Zn-vacancy complex, whereas the origin of the yellow-green band with its maximum at 5520 Å is not clear at this point, although it is tentatively assigned to an alkaline impurity complex in the cited literature.

Figure 6:
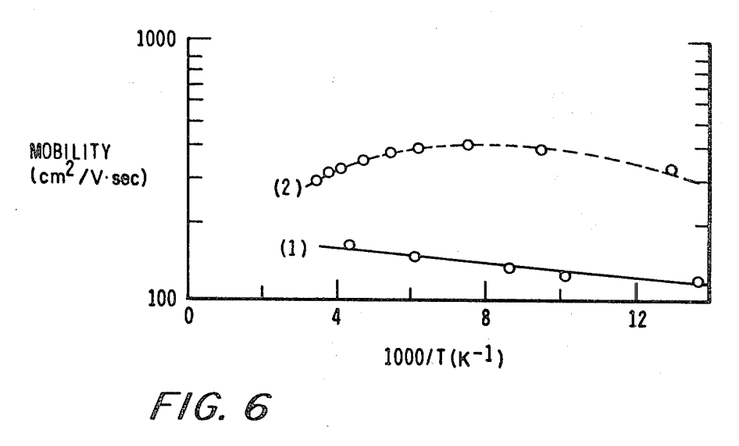
FIG. 6 characterizes the temperature dependence of the Hall mobility for a degenerate (1) and a nondegenerate (2) Al-doped n-type ZnSe layer deposited on a n-GaAs substrate.
Figure 7:
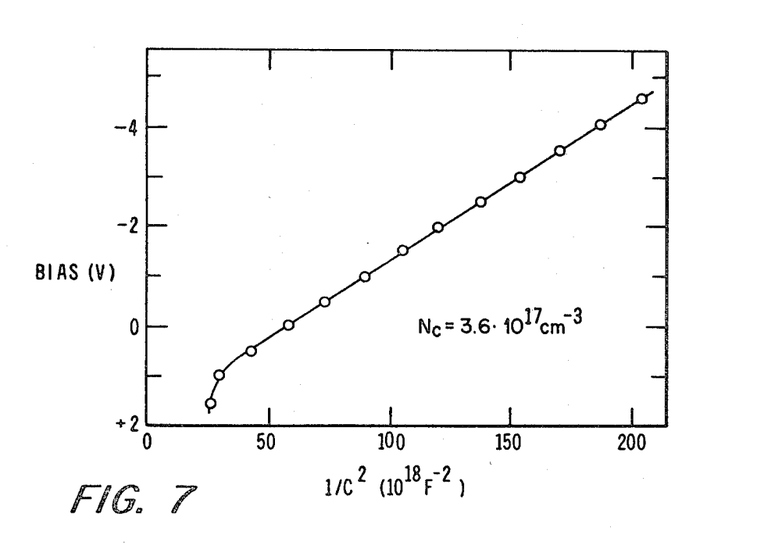
FIG. 7 is a graphic illustration of the capacitance/voltage measurements made on the device shown in FIG. 2.

The electrical transport properties of n-type ZnSe layers deposited on Cr-doped seminsulating GaAs substrates ($\rho$ greater than $10^7$ Ω.cm) were measured between 77K and 300K in a van-der-Pauw configuration. Electrical contacts were made to the ZnSe layers using a Hg-In alloy. The contacts were found to be ohmic after annealing in a forming gas above 220° C. for several minutes. Both degenerate and non-degenerate n-type ZnSe was obtained, with carrier concentrations at room temperature ranging from approximately $10^{16}$ cm$^{-3}$ to $2 \cdot 10^{18}$ cm$^{-3}$ and electrical resistivities ranging from 100 to $10^{-2}$ Ω.cm. Typical curves for the temperature-dependence of the carrier concentration $N_H$ and the Hall mobility $\mu_H$ are shown, respectively, in FIGS. 5 and 6. The layer labeled (1) in FIGS. 5 and 6 is degenerate n-type with a carrier concentration of $1.10^{18}$ cm$^{-3}$ independent of temperature. The Hall mobility of the sample under consideration increases with increasing temperature, pointing to impurity scattering as the major scattering mechanism. Layer (2) is non-degenerate with a carrier concentration of $1.6 \cdot 10^{17}$ cm$^{-3}$ at room temperature and an apparent activation energy of about 9 meV which is lower than the activation energy of approximately 26 MeV reported for shallow Al donors. The temperature dependence of $\mu_H$ follows the established curves for polar semiconductors.

The carrier concentration derived from Hall effect measurements correlates well with results obtained using C-V profiling. For the C-V profiling, a Schottky barrier device 70 shown in FIG. 2 was prepared. A n-ZnSe layer 74 was deposited on n-GaAs substrate 72 following the practiced method. An ohmic Au-Ge contact 76 was deposited on the bottom of the GaAs substrate prior to deposition of the ZnSe layer 74. A Au deposited dot served as a Shottky contact 78. Contact 78 had a diameter of 0.038 cm and was evaporated on top of the ZnSe layer 74. Several of these devices 70 were actually fabricated on a single wafer having a continuous n-type layer 74 deposited on the top surface of the n-type GaAs substrate 72.

Figure 2:
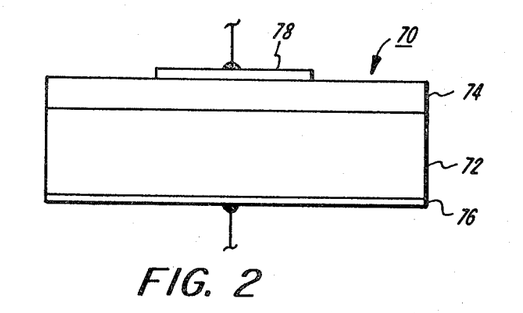
FIG. 2 is a side elevation of a Schottky barrier n-ZnSe/n-GaAs heterojunction device made in accordance with, and supporting the success of, the method of this invention.

The reverse breakdown voltage was found to be larger than 6 V. The carrier concentration, $N_c$, is related to the voltage dependence of the capacitance under reverse bias via the expression $$N_c = \frac{-2}{q \cdot \epsilon_0 \cdot \epsilon_s} \cdot \frac{dV}{d(1/C^2)}$$

where C is the capacitance per unit area, $\epsilon_s = 9.12$ is the dielectric constant of the ZnSe layer 74, and q the electron charge.

A plot of the reverse bias versus the inverse of the capacitance $[dV/d(1/C^2)]$ is shown in FIG. 4. The carrier concentration, $N_c$, calculated from the slope is $3.6 \cdot 10^{17}$ cm$^{-3}$, which is in good agreement with $N_H = 1.6 \cdot 10^{17}$ cm$^{-3}$ derived from the Hall effect data for the layer (2) in FIG. 5.

In conclusion, it has been demonstrated that epitaxial, higher conductive n-type ZnSe layers can be grown on GaAs substrates by low-pressure OM-CVD. The growth parameters employed in the practiced method, particularly the low temperature operation, tend to keep the number of impurties and intrinsic defects down as compared to previously employed methods used in providing doped II-VI compounds. Also, as a consequence of the lower temperatures used in the present method, there is a reduced probability of forming a donor-Zn-vacancy complex which acts as a deep electron trap in the n-doped ZnSe, for example, rather than a shallow donor. It appears that self-compensation is materially reduced in utilizing the method disclosed. Higher carrier concentrations may, therefore, also be achieved. Other CVD processes using a halide transport system may produced halide atom (e.g. Cl) incorporation as a self-compensation dopant impurity. Another important advantage of the OM-CVD process, is that no further or post treatment (diffusion or annealing) after growth is necessary.

The as-grown doped layers show a strong near-bandgap photoluminescence peak. The SA photoluminescence band is weaker by one order of magnitude, indicating a much smaller concentration of deep trapping centers than obtained by other growth and doping methods known in the art. Consequently, doped ZnSe layers, capable of being consecutively grown by OM-CVD, will, in particular, become important for heterojunction and light emitting devices.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. A method of depositing a doped epitaxial layer of a II-VI compound on the surface of a substrate in a deposition zone of a reactor of an organometallic chemical vapor deposition system comprising the steps of heating the deposition zone of the reactor to a temperature in the range of about 300° C. to 400° C. to produce pyrolytic action that provides sufficient surface mobility of the compound to be deposited to form a smooth epitaxially deposited layer, the temperature employed in said range being not so high as to produce a substantial concentration of native intrinsic defects, said defects being comparatively smaller in number relative to the number of electrically active doners therein, introducing into the reactor a gas phase composition containing a gaseous mixture of a reactant having a Group II containing component, a reactant having a Group VI containing component and a dopant selected from the Group III for n-type dopant or from the Group V for the p-type dopant, said step of introducing characterized by one of the gas phase reactants thereof and said selected dopant being initially introduced in close proximity to the substrate surface in the deposition zone whereas other gas phase reactants are introduced directly into the reactor proper.

selecting a low pressure environment in the range of about 10 mTorr to 200 mTorr in the reactor, said selection sufficient to suppress the probability of the gas phase pyrolytic reaction of said mixture prior to deposition thereof on the substrate.

forming said epitaxial layer by contacting the substrate with the introduced mixture in the deposition zone causing the pyrolyzation and deposition on the substrate of an elemental II and VI compound with a predetermined doping concentration.

2. The method of claim 1 which includes the step of varying the dopant concentration as deposited by adjusting the rate of flow of the vapor phase dopant by adjusting the partial pressure of the dopant in the gas phase or by adjusting the flow rate of the dopant relative to the flow rates of the reactants or a combination thereof.

3. The method of claim 1 wherein said dopant may be an alkyl compound containing an element selected from the group comprising aluminum, gallium or indium to provide n-type conductivity.

4. The method of claim 1 wherein said dopant may be either an alkyl or hydride compound containing an element selected from the group comprising phosphorus, arsenic or antimony to provide p-type conductivity.

5. The method of claim 1 wherein said epitaxial layer comprises a compound selected from the group consisting of zinc sulfide, zinc selenide, zinc telluride, or zinc sulfur selenide.

6. The method of claim 1 wherein said dopant is a triethyl or trimethyl of either aluminum, gallium or indium.

7. The method of claim 1 wherein said dopant is selected from the alkyl compounds consisting of a triethyl of phosphorus, arsenic or antimony or a trimethyl of arsenic or antimony, or from the hydride compounds consisting of ammonia, phosphine or arsine.

8. The method of claim 1 which includes the step of cooling down the deposited substrate in an $H_2Se$ ambient in the reactor to avoid loss of selenium therefrom.

9. The method of claim 1 wherein said substrate is mounted in the reactor at an angle relative to the longitudinal length of the reactor to enhance the gas flow pattern over the substrate surface thereby providing improved surface morphology.

* * * * *